US009063336B2

(12) United States Patent
Kirch et al.

(10) Patent No.: US 9,063,336 B2
(45) Date of Patent: Jun. 23, 2015

(54) OPTICAL ELEMENT HAVING A PLURALITY OF REFLECTIVE FACET ELEMENTS

(75) Inventors: Marc Kirch, Wedel (DE); Martin Endres, Koenigsbronn (DE); Damian Fiolka, Oberkochen (DE); Joachim Hartjes, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 597 days.

(21) Appl. No.: 13/486,073

(22) Filed: Jun. 1, 2012

(65) Prior Publication Data

US 2012/0293785 A1    Nov. 22, 2012

Related U.S. Application Data

(63) Continuation of application No. PCT/EP2010/067520, filed on Nov. 16, 2010.

(30) Foreign Application Priority Data

Dec. 17, 2009    (DE) .......................... 10 2009 054 888

(51) Int. Cl.
  *G03B 27/68* (2006.01)
  *G03B 27/54* (2006.01)
  (Continued)

(52) U.S. Cl.
  CPC .......... *G02B 26/0816* (2013.01); *G02B 5/0891* (2013.01); *G02B 5/09* (2013.01);
  (Continued)

(58) Field of Classification Search
  CPC ............ G03F 7/70075; G03F 7/70091; G03F 7/70108; G03F 7/70133; G03F 7/70141; G03F 7/70116; G03F 7/7015; G03F 7/702; G02B 26/0816; G02B 27/0927; G02B 27/0977; G02B 5/0891; G02B 5/09; G02B 7/1822
  USPC ........... 355/52, 53, 55, 67–71, 77; 250/492.1, 250/492.2, 492.22, 548; 359/196.1, 201.2, 359/212.1, 212.2, 216.1–221.1, 223.1, 359/225.1, 226.1, 226.2, 874, 876
  See application file for complete search history.

(56) References Cited

U.S. PATENT DOCUMENTS 4,738,499 A * 4/1988 Mikami et al. .................. 359/18
4,793,672 A * 12/1988 McGrath, Jr. .............. 359/216.1
(Continued)

FOREIGN PATENT DOCUMENTS

DE          102 05 425 A1    5/2003
DE      10 2008 040 742      2/2009
(Continued)

OTHER PUBLICATIONS

The International Search Report for corresponding PCT Appl No. PCT/EP2010/067520, dated Jun. 20, 2011.
(Continued)

*Primary Examiner* — Christina Riddle
(74) *Attorney, Agent, or Firm* — Fish & Richardson P.C.

(57) ABSTRACT

An optical element for use in an illumination optical unit of an EUV microlithography projection exposure apparatus includes a plurality of reflective facet elements. Each reflective facet element has at least one reflective surface. In this case, at least one facet element is arranged in a manner rotatable about a rotation axis. The rotation axis intersects the at least one reflective surface of the facet element. With such an optical element, it is possible to alter the direction and/or the intensity of at least part of the illumination radiation within the illumination optical unit in a simple manner.

29 Claims, 8 Drawing Sheets

(51) Int. Cl.
*G03B 27/72* (2006.01)
*G02B 26/08* (2006.01)
*G02B 5/09* (2006.01)
*G02B 7/182* (2006.01)
*G02B 27/09* (2006.01)
*G03F 7/20* (2006.01)
*G02B 5/08* (2006.01)

(52) U.S. Cl.
CPC ......... *G02B 7/1822* (2013.01); *G02B 27/0927* (2013.01); *G02B 27/0977* (2013.01); *G03F 7/70116* (2013.01); *G03F 7/70075* (2013.01)

(56) References Cited

U.S. PATENT DOCUMENTS

| | | | | |
|---|---|---|---|---|
| 5,000,529 | A * | 3/1991 | Katoh et al. | 359/216.1 |
| 6,292,285 | B1 * | 9/2001 | Wang et al. | 359/204.1 |
| 7,246,909 | B2 | 7/2007 | Seifert et al. | |
| 8,587,767 | B2 * | 11/2013 | Fiolka et al. | 355/71 |
| 2002/0181851 | A1 * | 12/2002 | Brown et al. | 385/18 |
| 2003/0043359 | A1 * | 3/2003 | Naulleau | 355/71 |
| 2005/0030653 | A1 | 2/2005 | Holderer et al. | |
| 2005/0174650 | A1 | 8/2005 | Melzer et al. | |
| 2006/0103908 | A1 | 5/2006 | Loopstra et al. | |
| 2007/0041004 | A1 * | 2/2007 | Suzuki | 355/67 |
| 2009/0041182 | A1 | 2/2009 | Endres et al. | |
| 2009/0135392 | A1 * | 5/2009 | Muramatsu | 355/67 |
| 2009/0251677 | A1 | 10/2009 | Endres et al. | |
| 2010/0103400 | A1 | 4/2010 | Deguenther et al. | |
| 2011/0001947 | A1 | 1/2011 | Dinger et al. | |
| 2011/0228244 | A1 * | 9/2011 | Mann | 355/67 |
| 2012/0293784 | A1 | 11/2012 | Xalter et al. | |
| 2013/0100426 | A1 | 4/2013 | Warm et al. | |

FOREIGN PATENT DOCUMENTS

| | | |
|---|---|---|
| EP | 1 233 292 | 4/2009 |
| JP | 7-333528 | 12/1995 |
| JP | 2005-508520 | 3/2005 |
| JP | 2006-140504 | 6/2006 |
| JP | 2009-244120 | 10/2009 |
| JP | 2009-535827 | 10/2009 |
| JP | 2010-519725 | 6/2010 |
| JP | 2011-503831 | 1/2011 |
| JP | 2011-512659 | 4/2011 |
| KR | 10-2009-0116731 | 11/2009 |
| WO | WO 03/040796 | 5/2003 |
| WO | WO 2008/131930 | 11/2008 |
| WO | WO 2009/100856 | 8/2009 |

OTHER PUBLICATIONS

German Office Action, with English translation, for corresponding DE Application No. 10 2009 054 888.2-51, dated Sep. 3, 2010.

The International Preliminary Report on Patentability, with English translation, for corresponding PCT Appl No. PCT/EP2010/067520, dated Jun. 20, 2011.

Japanese Office Action, with translation thereof, for JP Appl No. 2012-543559, dated Aug. 22, 2013.

Korean Office Action, with translation thereof, for KR Appl No. 10-2012-7018764, dated Aug. 12, 2013.

* cited by examiner

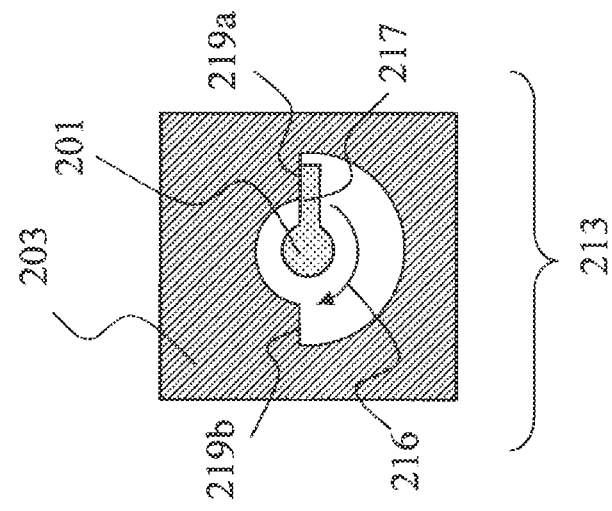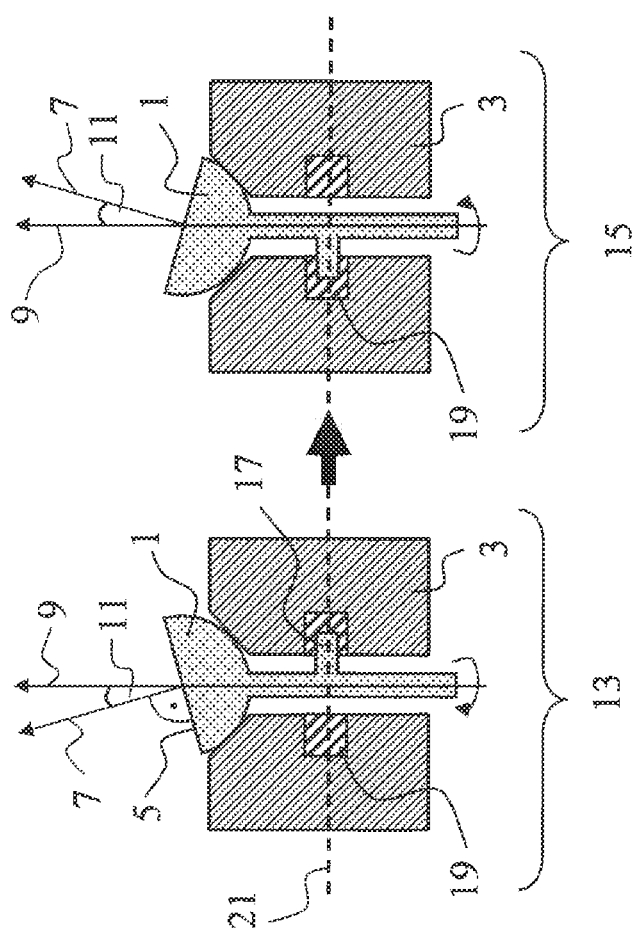

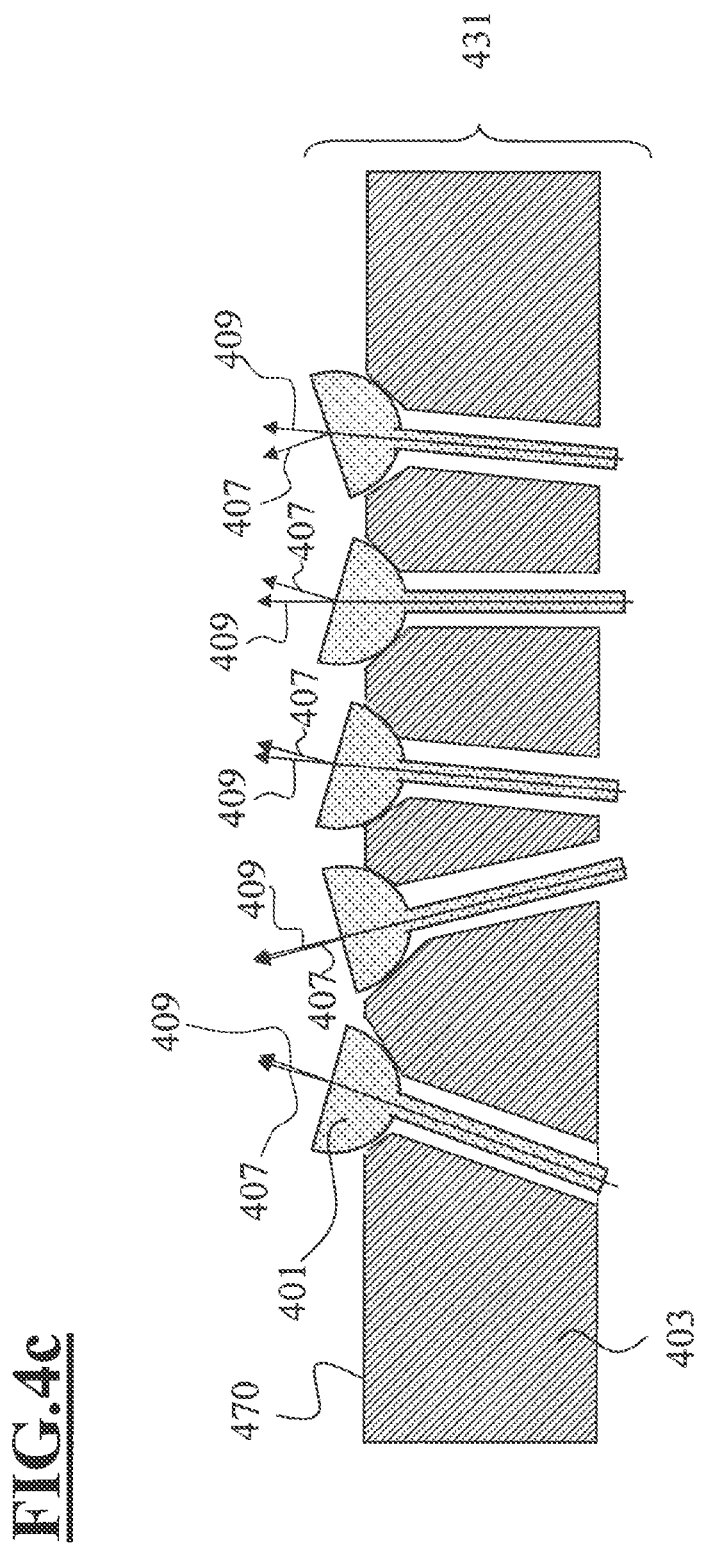

OPTICAL ELEMENT HAVING A PLURALITY OF REFLECTIVE FACET ELEMENTS

CROSS-REFERENCE TO RELATED APPLICATIONS

This application is a continuation of, and claims benefit under 35 USC 120 to, international application PCT/EP2010/067520, filed Nov. 16, 2010, which claims benefit under 35 USC 119 of German Application No. 10 2009 054 888.2, filed Dec. 17, 2009. International application PCT/EP2010/067520 is hereby incorporated by reference in its entirety.

FIELD

The present disclosure relates to an optical element for use in an illumination optical unit of an EUV microlithography projection exposure apparatus, to an illumination optical unit for use in an EUV microlithography projection exposure apparatus, to a microlithography projection exposure apparatus, and to a method for altering an illumination distribution generated with the aid of an illumination optical unit according to the disclosure.

BACKGROUND

Microlithography projection exposure apparatuses serve for producing microstructured components via a photolithographic method. In this case, a structure-bearing mask, the so-called reticle, is illuminated with the aid of a light source unit and an illumination optical unit and is imaged with the aid of a projection optical unit onto a photosensitive layer. In this case, the light source unit provides radiation that is directed into the illumination optical unit. The illumination optical unit serves to provide a uniform illumination with a predetermined angle-dependent intensity distribution at the location of the structure-bearing mask. For this purpose, various suitable optical elements are provided within the illumination optical unit. The structure-bearing mask illuminated in this way is imaged with the aid of the projection optical unit onto a photosensitive layer. In this case, the minimum structure width that can be imaged with the aid of such a projection optical unit is determined, among other things, by the wavelength of the radiation used. The smaller the wavelength of the radiation, the smaller the structures that can be imaged with the aid of the projection optical unit. Imaging radiation having a wavelength in the range of 193 nm or imaging radiation in the range of extreme ultraviolet (EUV), i.e. in the range of 5 nm to 15 nm, is principally used in this case. When radiation having a wavelength in the range of 193 nm is used, both refractive optical elements and reflective optical elements are used within the illumination optical unit and the projection optical unit. By contrast, when imaging radiation having a wavelength in the range of 5 nm to 15 nm is used, exclusively reflective optical elements (mirrors) are used.

In a microlithography projection exposure apparatus it is desirable for uniform irradiation conditions to be present throughout operation at the photosensitive layer. It is only in this way that, in general, microstructured components having uniform quality can be produced. Therefore, the irradiation conditions at the structure-bearing mask are desirably as uniform as possible. In this case, at the structure-bearing mask, both the intensity distribution of the incident radiation over the location on the mask and the angle-dependent intensity distribution at each location of the mask should satisfy predetermined conditions. However, various influences can alter the intensity distribution and the angle-dependent intensity distributions at the structure-bearing mask during operation. This can be e.g. heating of reflective optical elements, which thereupon change their position or form slightly. Furthermore, it is possible for the light source unit to experience alterations. By way of example, positional alterations of the source plasma that generates the radiation with respect to a collector come into consideration. Furthermore, by way of example, contaminations can also have the effect that the reflectivity of individual or all optical elements of the light source unit or of the illumination optical unit is altered. All these influences lead to an alteration of the radiation distributions at the structure-bearing mask. For this reason, it is desirable for the illumination optical unit to be embodied in such a way that it can be reconfigured in a simple manner in order to react to such system alterations described.

SUMMARY

Accordingly, the present disclosure provides an optical element for use in an illumination optical unit of an EUV microlithography projection exposure apparatus which makes it possible to alter the direction and/or the intensity of at least part of the illumination radiation within the illumination optical unit in a simple manner. Furthermore, the present disclosure provides a corresponding illumination optical unit and a correspondingly developed microlithography projection exposure apparatus.

The present disclosure also provides a method which can alter the direction and/or the intensity of at least part of the illumination radiation within the illumination optical unit in a simple manner.

In one aspect, an optical element for use in an illumination optical unit of an EUV microlithography projection exposure apparatus includes a plurality of reflective facet elements each having at least one reflective surface. In this case, at least one facet element is arranged in a manner rotatable about a rotation axis, wherein the rotation axis intersects the at least one reflective surface of the facet element. This has the advantage that the desired mechanical suspension and actuator system for rotation can be fitted on the radiation-remote side of the reflective surface. This results in a very compact design which enables a large number of facet elements according to the disclosure to be arranged in a densely packed manner alongside one another, such that the reflective surfaces of the individual facet elements are at a small distance from one another.

In one embodiment, the optical element is designed in such a way that the at least one facet element is rotatable only between two rotation end positions. For many applications it suffices if the facet element can be set precisely in exactly two positions. In such a case, it is advantageous if the facet element is rotatable only between two rotation end positions, since it suffices to precisely mechanically define the rotation end positions and it is possible to dispense with being able to set all possible rotation positions with the same accuracy. This simplifies the mechanical realization, since, by way of example, a high-precision servomotor can be dispensed with. Instead, the precision is predetermined by the static rotation end positions.

In one specific case for such an embodiment, the at least one facet element is arranged in a rotatable manner in a carrier element, wherein the carrier element and the facet element each have end stops that define the rotation end positions. This has the advantage that a sufficient precision of the rotation end positions is achieved in a simple manner via high-precision end stops that are mechanically easy to produce.

In a further embodiment of the optical element, the reflective surface of the at least one facet element has a normal vector whose direction defines the orientation of the reflective surface spatially, wherein the angle between the normal vector and the rotation axis is less than 20°.

A normal vector with respect to a reflective surface is defined as a vector of length 1 which is perpendicular to the reflective surface at the midpoint of the surface. Therefore, the direction of the normal vector defines the orientation of the reflective surface spatially. The angle of less than 20° additionally reinforces the advantage of the compact design already mentioned. Mechanical suspension and actuator systems for rotation are typically arranged substantially along the rotation axis. Given an angle between the normal vector and the rotation axis which is less than 20°, therefore, a large portion of the desired mechanical suspension and actuator system for rotation can be fitted on the radiation-remote side of the reflective surface, such that a large number of facet elements according to the disclosure can be packed densely alongside one another, without large distances between the reflective surfaces arising.

In one embodiment of the optical element, the reflective surface of the at least one facet element has a normal vector whose direction defines the orientation of the reflective surface spatially, wherein the angle between the normal vector and the rotation axis is different than zero. In particular, the angle is greater than 1°, preferably greater than 1°, particularly preferably greater than 2°. This has the advantage that the direction of the normal vector and hence the orientation of the reflective surface can be altered by rotating the facet element about the rotation axis. The alteration is all the greater, the greater the angle between rotation axis and normal vector.

In a further embodiment, the optical element for use in an illumination optical unit of an EUV microlithography projection exposure apparatus includes a plurality of reflective facet elements, wherein at least one facet element has at least one first reflective surface and one second reflective surface and is arranged in a manner rotatable about a rotation axis. Such an element makes it possible to bring different reflective surfaces into a beam path via rotation about the rotation axis.

In one advantageous development, the rotation axis forms a first angle with a first normal vector with respect to the first optical surface and a second angle with a second normal vector with respect to the second optical surface, wherein the first and the second angle differ by more than 1°. This has the advantage that, via rotation about the rotation axis, it is possible to define whether radiation is applied to the first or the second optical surface when the optical element is used. What is achieved by virtue of the fact that the normal vectors of the two reflective surfaces form different angles with the rotation axis is that the impinging radiation is reflected at different reflection angles depending on which of the two surfaces it impinges on. In this case, the reflection angle is understood to mean the angle between incident radiation and reflected radiation.

Alternatively or supplementarily, the first and the second reflective surface have a different reflectivity, such that the impinging radiation is reflected with different intensity depending on which of the two surfaces it impinges on.

In a further variant, both the angles of the normal vectors with respect to the rotation axis and the reflectivities of the two reflective surfaces are different, such that both a different reflection angle and a different intensity of the reflected radiation are achieved.

In one developed embodiment, the at least one facet element is connected to an actuator for rotation about the rotation axis. As a result, it is possible to bring about a rapid change of the rotation positions and it is possible to react very flexibly to changes in the light source unit or the illumination optical unit.

An illumination optical unit for use in an EUV microlithography projection exposure apparatus including an optical element according to the disclosure has the same advantages as have been described with regard to the optical element.

In another aspect, the disclosure provides an illumination optical unit for use in an EUV microlithography projection exposure apparatus which includes an optical element having a plurality of reflective facet elements, wherein at least one facet element has at least one first reflective surface and one second reflective surface and is arranged in a manner rotatable about a rotation axis. In this case, the optical element is embodied in such a way that, during the operation of the illumination optical unit, radiation is applied only to the first reflective surface in a first rotation position of the facet element and only to the second reflective surface in a second rotation position, but radiation is not applied to both reflective surfaces simultaneously. This has the advantage that, via rotation about the rotation axis, it is possible to define in a simple manner whether radiation is applied to the first or the second optical surface when the optical element is used. The reflected radiation can be influenced in different ways depending on the properties of the two reflective surfaces.

In one development, the first reflective surface has a first normal vector in the first rotation position, and the second reflective surface has a second normal vector in the second rotation position. In this case, the angle between the first and the second normal vector is greater than 1°, such that the impinging radiation is reflected at a different reflection angle depending on which of the two surfaces it impinges on.

In an alternative or supplementary development, the first and the second reflective surface have a different reflectivity for the incident radiation. This makes possible a targeted easy attenuation of the radiation intensity of the reflected radiation via the reflective surface having the lower reflectivity being brought into a position in which radiation is applied to it.

In one advantageous development, the illumination optical unit includes a measuring system and a control system, which is signal-connected to the measuring system and to an actuator for rotating the at least one facet element about the rotation axis, such that the actuator can be driven on the basis of a signal of the measuring system. It is thereby possible to react in a targeted manner and rapidly to changes registered by the measuring system, such that the illumination optical unit does not have to be deactivated, or does not have to be deactivated for long. As soon as the information supplied by the measuring system to the control system indicates a change that cannot be afforded tolerance, a control signal can be generated which drives an actuator that rotates the facet element about the rotation axis, thus resulting in a correction.

In one developed form, the measuring system is designed for measuring an angle-dependent intensity distribution at the object field. In this case, an angle-dependent intensity distribution is understood to be a function indicating the intensity of the incident radiation at a location depending on the direction of incidence. In this case, the direction of incidence can be parameterized by two angles of incidence. Such an embodiment of the measuring system has the advantage that a measurement variable is determined which directly influences the quality of the subsequent imaging. Moreover, the angle-dependent intensity distribution is in a simple relationship with the intensity distribution on the second optical element, since the latter is usually arranged in a pupil plane of the illumination optical unit. The influence of a rotation of a facet element of the second optical element about the rotation axis on the angle-dependent intensity distribution can therefore be predicted particularly well, such that a correction of undesired changes can be performed in a simple manner.

In a further aspect of the disclosure, the illumination optical unit for illuminating an object field in an object plane includes a first optical element having at least one first and one second reflective facet element and a second optical element having at least one first and one second reflective facet element. In this case, the second optical element is embodied in such a way that at least one of the reflective facet elements of the second optical element can assume a first position, in which, during the operation of the illumination optical unit, it directs a radiation beam emerging from the first reflective facet element of the first optical element in the direction of the object field, and a second position, in which, during the operation of the illumination optical unit, it directs a radiation beam emerging from the second reflective facet element of the first optical element in the direction of the object field. In the first position, the at least one reflective facet element of the second optical element is thus assigned to the first reflective facet element of the first optical element, and in the second position it is assigned to the second reflective facet element of the first optical element. Depending on the assignment, therefore, either a radiation beam that emerges from the first reflective facet element of the first optical element is deflected by the at least one reflective facet element of the second optical element in the direction of the object field, or a radiation beam which emerges from the second reflective facet element of the second optical element. As a result of a change in the position of the at least one reflective facet element, that is to say as a result of a change in the assignment of the facet elements of the first optical element to the facet elements of the second optical element, it is therefore possible to bring about a change in the intensity distribution over the object field and in the angle-dependent intensity distribution at the location of the object field, since, depending on the position, different radiation beams are directed onto the object field.

In one developed form of the illumination optical unit, in addition the first optical element is embodied in such a way that at least one of the reflective facet elements of the first optical element can assume a first position, in which, during the operation of the illumination optical unit, it directs radiation onto a first reflective facet element of the second optical element, and a second position, in which, during the operation of the illumination optical unit, it directs radiation onto a second reflective facet element of the second optical element.

This development makes it possible that a radiation beam that emerges from a first facet element of the first optical element can reach the object field on different paths in the illumination optical unit, depending on the position of the facet elements of the first optical element and the facet elements of the second optical element. A very flexible adaptation of the angle-dependent intensity distribution at the location of the object field is thereby achieved, since the same radiation beam reaches the object field from a first direction in the case of a first setting of the facet elements and reaches the object field from a second direction in the case of a second setting of the facet elements. In this way it is possible to at least partly correct alterations in the angle-dependent intensity distribution at the location of the object field, which occur, for example, as a result of contaminations of optical elements during operation.

In a first variant of the disclosure, the second optical element is embodied in such a way that at least one of the reflective facet elements of the second optical element can assume, besides the first and second positions described, a third position, in which it directs no radiation beam in the direction of the object field.

In a second variant of the disclosure, the illumination optical unit for illuminating an object field in an object plane includes a first optical element having at least one first reflective facet element and a second optical element having at least one first reflective facet element. In this case, the second optical element is embodied in such a way that at least one of the reflective facet elements of the second optical element can assume a first position, in which, during the operation of the illumination optical unit, it directs a radiation beam emerging from the first reflective facet element of the first optical element in the direction of the object field, and a second position, in which it directs no radiation beam in the direction of the object field.

In both variants, it is possible to at least partly correct alterations in the angle-dependent intensity distribution at the location of the object field. This takes place by virtue of the fact that in one position the normal vector of the reflective surface of the at least one reflective facet element of the second optical element is oriented in such a way that a beam of rays that impinges on the reflective surface is not reflected in the direction of the object field, but rather, for example, in the direction of a diaphragm or an enclosure of the illumination optical unit. The beam of rays is therefore shaded and does not reach the object field. By simply changing the position of a facet element, it is therefore possible to shade a beam of rays in a targeted manner. Since, at this position, the precise direction of the reflected beam of rays is not of importance and the precise direction of the normal vector is therefore not of importance, such a position can be realized in a simple manner.

A microlithography projection exposure apparatus including an illumination optical unit described last has the same advantages that were explained with regard to the illumination optical unit.

The disclosure furthermore provides a method for altering an angle-dependent intensity distribution of a radiation at the location of an object field, wherein the angle-dependent intensity distribution was generated with the aid of an illumination optical unit described above. In the case of such an illumination optical unit, radiation impinges on the optical element according to the disclosure during operation, such that a plurality of radiation beams arise after reflection at the plurality of reflective facet elements. As a result of the rotation of the at least one facet element about the rotation axis, either the reflection angle or the intensity or both change(s) for at least one radiation beam. This has the advantage that a flexible change in the angle-dependent intensity distribution can be achieved via simple rotation of the facet element.

One developed form of the method according to the disclosure involves first measuring the angle-dependent intensity distribution at the location of the object field and then rotating at least one facet element on the basis of this measurement, such that the angle-dependent intensity distribution at the location of the object field changes. As a result, changes in the angle-dependent intensity distribution which are registered during the measurement can be corrected at least partly by rotating the at least one facet element.

BRIEF DESCRIPTION OF THE DRAWINGS

The disclosure will be explained in greater detail with reference to the drawings.

FIG. 1 shows, in two partial figures, an embodiment of a reflective facet element in two rotation positions.

FIG. 2 shows a section through the reflective facet element according to FIG. 1.

FIGS. 4a and 4b schematically show the functioning of the optical element according to the disclosure as second optical element in the illumination optical unit according to FIG. 3a.

FIG. 4c shows an excerpt from an optical element according to the disclosure in a developed form.

FIG. 8b shows a plan view of an optical element including a plurality of reflective facet elements which are connected to one another in groups in accordance with the embodiment according to FIG. 8a.

DETAILED DESCRIPTION

Figure 3A:
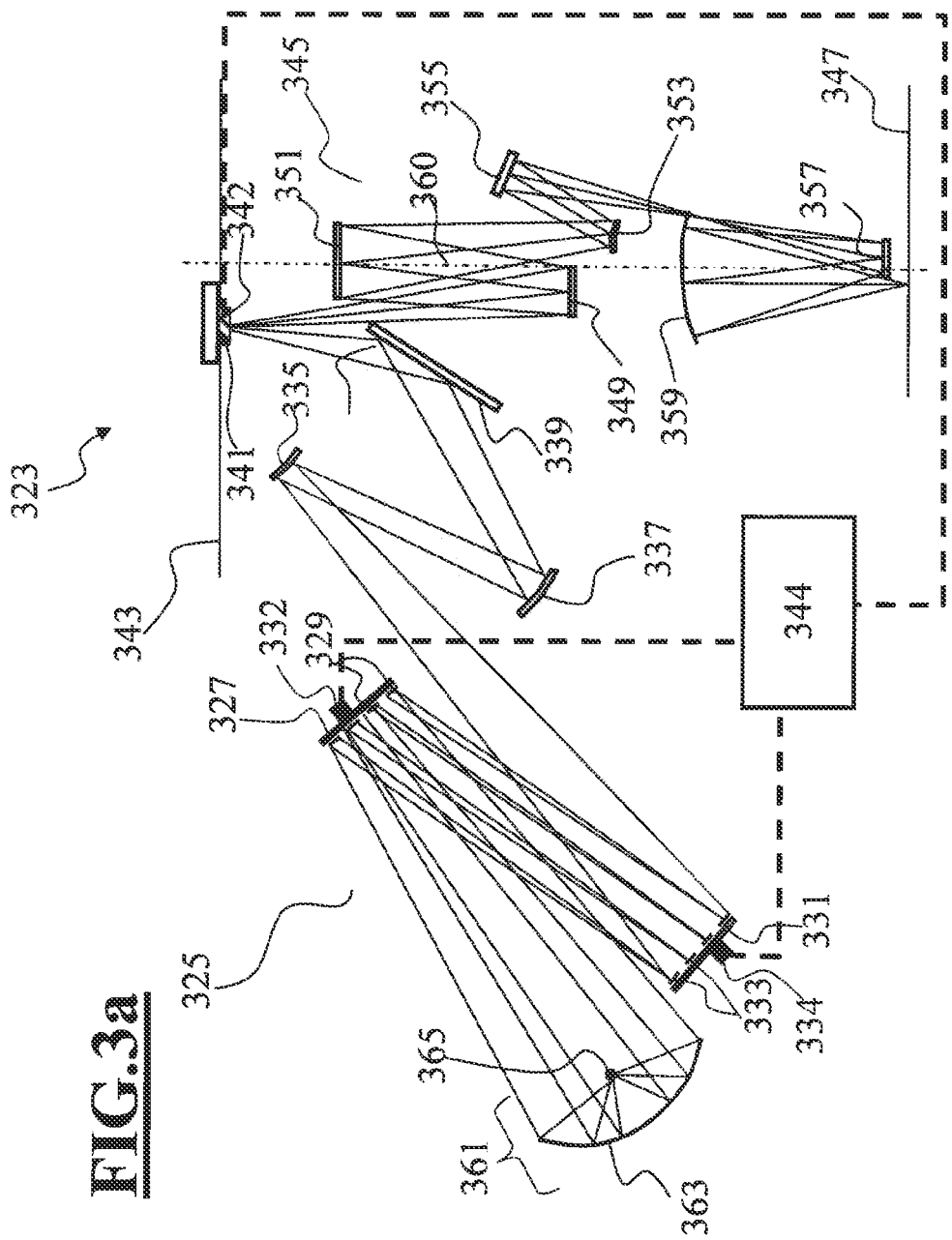
FIG. 3a shows a projection exposure apparatus according to the disclosure including an illumination optical unit.

The reference signs have been chosen such that objects illustrated in FIG. 1 have been provided with one-digit or two-digit numbers. The objects illustrated in the further figures have reference signs having three or more digits, the last two digits indicating the object and the preceding digit indicating the number of the figure in which the object is illustrated. Therefore, the reference numerals of identical objects illustrated in a plurality of figures correspond in terms of the last two digits. If appropriate, the description of these objects is found in the text concerning a previous figure.

FIG. 1 shows a reflective facet element 1 arranged in rotatable fashion in a carrier element 3. In this case, the reflective facet element 1 has a reflective surface 5 having a normal vector 7, the direction of which defines the orientation of the reflective surface 5 spatially. In this case, the reflective facet element 1 is arranged in a manner rotatable about the rotation axis 9. The rotation axis 9 firstly intersects the reflective surface 5 and secondly forms an angle 11 different than 0° with the normal vector 7. This configuration makes it possible to alter the direction of the normal vector 7 by rotating the reflective facet element 1 about the rotation axis 9. Particularly the feature that the rotation axis 9 intersects the reflective surface 5 has the advantage that the desired mechanical suspension and actuator system for rotation can be fitted on the radiation-remote side of the reflective surface. This results in a very compact design which makes it possible to arrange a large number of facet elements according to the disclosure alongside one another in a densely packed manner. These advantages are additionally reinforced if the angle between the normal vector and the rotation axis is less than 20°. Upon a rotation of the reflective facet element 1 about the rotation axis 9, the normal vector 7 circumscribes a cone whose opening angle is twice the magnitude of the angle 11 between the rotation axis 9 and the normal vector 7. In this case, the vortex of the cone lies at the intersection point between the axis of rotation 9 and the reflective surface 5.

FIG. 1 shows the reflective facet element 1 in a first rotation position 13 and in a second rotation position 15. In this case, the two rotation positions 13 and 15 differ by a rotation by 180°. This has the effect that the angle between the normal vector 7 in the first rotation position 13 and the normal vector 7 in the second rotation position 15 is twice the magnitude of the angle 11 between the rotation axis 9 and the normal vector 7. This occurs whenever the rotation axis 9 is parallel to the sum of the normal vectors 7 in the two rotation positions. In order, accordingly, to have the effect that the normal vectors in two rotation positions differ by an angle that is greater than 2°, the angle 11 between the rotation axis and the normal vector 7 has to be chosen to be greater than 1°. An angle of greater than 2° is advantageous in order to ensure, via the rotation, a sufficient change in the reflection angle of an impinging radiation beam, as explained with reference to FIG. 4a and FIG. 4b.

In the embodiment according to FIG. 1, the reflective facet element 1 has a cam 17, which is arranged on the reflective facet element 1 in such a way that it alters its position upon rotation of the reflective facet element 1 about the rotation axis 9. In this case, the carrier element 3 has stop surfaces 19, which limit the movement of the cam 17 during the rotation about the rotation axis 9. In this way, the facet element 1 cannot assume any arbitrary rotation position, but rather is rotatable only between two rotation end positions. In this case, the rotation end positions are defined by the mechanical arrangement of the cam 17 and of the stop surface 19, which are designated as end stops. For better illustration, FIG. 2 shows a section through the reflective facet element 1 in the carrier element 3. In this case, the section was taken in the region of the cam 17 and of the stop surfaces 19 along the dashed line 21 from FIG. 1. The first rotation position 13 from FIG. 1 is shown. In this case, the cam 217 bears directly against the stop surface 219a, such that the reflective facet element 201 can only be rotated in the clockwise direction (indicated by the arrow 216) until the cam 217 butts against the stop surface 219b. Consequently, the stop surface 219b prescribes a first rotation end position with regard to rotations in the clockwise direction. Correspondingly, the stop surface 219a together with the cam 217 defines a second rotation end position with regard to rotations in the counterclockwise direction. Since the end stops (cam 217, stop surfaces 219a, 219b) can be mechanically fabricated very precisely, the rotation end positions can be predetermined very precisely. Consequently, the direction of the normal vector 7 (FIG. 1) is also defined very precisely if the reflective facet element 1 is situated in a rotation end position. The facet element can also additionally be stopped between the rotation end positions in order to realize a further, third position. This is advantageous particularly when shading of an impinging beam of rays is intended to be achieved via the third position. Typically, such a third position between two rotation end positions cannot be set as precisely as one of the two rotation end positions. However, this is also not necessary, since, for shading an impinging beam of rays, it suffices if the radiation beam is reflected in a direction as long as it is not reflected in the direction of the object field.

In the embodiment according to FIG. 2, the two rotation end positions differ by a rotation about the rotation axis by an angle of 180°. Rotation angles other than 180° can likewise be achieved via suitable mechanical embodiment of the cam 217 and of the stop surfaces 219a and 219b. The embodiment with end stops should be understood as optional. An embodiment without end stops is likewise possible.

FIG. 3a shows one configuration of a projection exposure apparatus 323 according to the disclosure including an illumination optical unit 325. The illumination optical unit 325 in this case includes a first optical element 327 having a plurality of first reflective facet elements 329 and a second optical element 331 having a plurality of second reflective facet elements 333. A first telescope mirror 335 and a second telescope mirror 337 are arranged in the light path downstream of the second optical element 331, the telescope mirrors both being operated with normal incidence, that is to say that the radiation impinges on both mirrors at an angle of incidence of between 0° and 45°. In this case, the angle of incidence is understood to be the angle between incident radiation and the normal to the reflective surface. A deflection mirror 339 is arranged downstream and directs the radiation impinging on it onto the object field 341 in the object plane 343. The deflection mirror 339 is operated with grazing incidence, that is to say that the radiation impinges on the mirror at an angle of incidence of between 45° and 90°. A reflective structure-bearing mask is arranged at the location of the object field 341, and is imaged into the image plane 347 with the aid of the projection lens 345. The projection lens 345 includes six mirrors 349, 351, 353, 355, 357 and 359. All six mirrors of the projection lens 345 each have a reflective surface extending along a surface that is rotationally symmetrical about the optical axis 360.

Figure 3B:
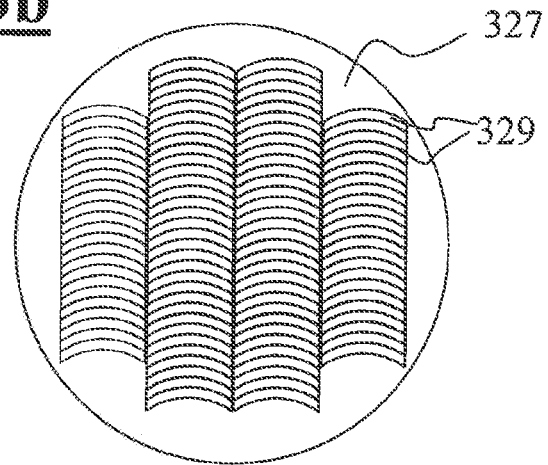
FIG. 3b shows a plan view of the first optical element.

FIG. 3b shows a plan view of the first optical element 327, which includes a plurality of first reflective facet elements 329.

Figure 3C:
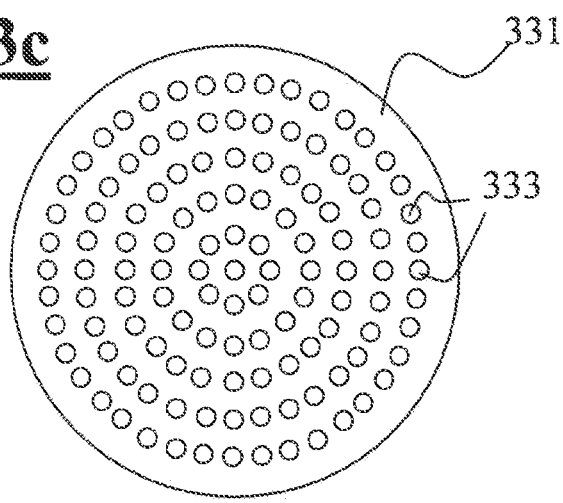
FIG. 3c shows a plan view of the second optical element.

FIG. 3c shows a corresponding plan view of the second optical element 331 having a plurality of second reflective facet elements 333. The number of first reflective facet elements 329 can be of exactly the same magnitude as the number of second facet elements 331. Alternatively, the number of first facet elements 329 can also be greater or less than the number of second facet elements 331.

The microlithography projection exposure apparatus according to FIG. 3a furthermore includes a light source unit 361, which directs radiation onto the first optical element 327. In this case, the light source unit 361 includes a source plasma 365 and a collector mirror 363. The light source element 361 can be designed in various embodiments. It can be a laser plasma source (LPP), in which a narrowly delimited source plasma 365 is generated by a small material droplet being irradiated with a high-energy laser. Alternatively, it can be a discharge source, in which the source plasma 365 is generated with the aid of a discharge. In both cases, a luminous source plasma 365 occurs which emits radiation in particular in the wavelength range of 5 nm-15 nm. The radiation is collected with the aid of the collector mirror 363 and directed onto the first optical element 327. In this case, the collector mirror 363 and the first facet elements 329 have an optical effect such that images of the source plasma 365 arise at the locations of the facet elements 333 of the second optical element 331. For this purpose, firstly the focal length of the collector mirror 363 and that of the first facet elements 329 are chosen in accordance with the spatial distances. This is done, for example, by providing the reflective surfaces of the first reflective facet elements 329 with suitable curvatures. Secondly, the first facet elements 329 have a reflective surface having a normal vector, the direction of which defines the orientation of the reflective surface spatially, wherein the normal vectors of the reflective surfaces of the first facet elements 329 are oriented in such a way that the radiation reflected by a first facet element 329 impinges on a specifically assigned second facet element 333. This assignment between first facet elements 329 and second facet elements 333 makes it possible to adapt the intensity distribution of the radiation on the second optical element 331. Typically, the light source unit 361 does not generate a uniform intensity distribution on the first optical element 327, such that there are first facet elements which are irradiated with radiation having a higher intensity than other first facet elements. The setting of the orientation of the reflective surfaces of the first facet elements 329 predetermines which first facet elements 329 are assigned to which second facet elements 333, that is to say onto which they direct radiation. Consequently, while the intensity distribution of the radiation on the first optical element 327 is predetermined by the properties of the light source unit or of possible further optical elements between light source unit and first optical element, the intensity distribution on the second optical element 331 can be set by the choice of the orientations of the reflective surfaces of the first facet elements 329. This is referred to as a mixing of the radiation by the optical elements 327 and 331, since the intensity distribution on the second optical element 331 differs from the intensity distribution on the first optical element 327. The intensity distribution on the second optical element 331 is of particular importance since the second optical element is arranged in a pupil plane of the illumination optical unit 325 and thus in a plane that is optically conjugate with respect to the entrance pupil plane of the projection optical unit 345. For this reason, the intensity distribution of the radiation on the second optical element 331 is in a simple relationship with the angle-dependent intensity distribution of the radiation in the region of the object field 341 and leads to significant influences on the quality of the imaging by the projection optical unit 345. Therefore, the orientations of the reflective surfaces of the first facet elements 329 are set in such a way as to result in a desired intensity distribution on the second optical element 331. However, relatively large alterations of the intensity distribution on the first optical element 327 lead to changes in the intensity distribution on the second optical element 331. A contamination of the collector 363 during operation leads, for example, to significant changes in the intensity distribution on the first optical element 327. As a result, the intensity distribution on the second optical element 331 likewise changes and deviates from the desired intensity distribution. This alteration can be measured during operation, according to the disclosure, by measuring the angle-dependent intensity distribution of the radiation for example in the edge region of the object field 341. For this purpose, a measuring system 342 is arranged near the object field 341. Measuring systems of this type are known from DE 10 2007 061 194 A1. The measuring system 342 is signal-connected to a control system 344. Furthermore, the control system is signal-connected to at least one actuator 332 connected to at least one first facet element 329. In addition, the control system 344 is signal-connected to a further actuator 334, which is connected to at least one second facet element 333. On the basis of the measurement of the measuring system, the control system 344 generates a control signal, which is used to drive at least one actuator 334 for rotating a second facet element 333. Furthermore, the control system generates a second control signal, which is used to drive at least one actuator 332 for altering the orientation of the reflective surface of a first facet element 329. In this case, the first facet elements 329 are embodied in such a way that at least one portion of the facet elements 329 has a reflective surface having a normal vector, the direction of which spatially can be altered with the aid of a connected actuator 332. For this purpose, the first facet elements 329 are embodied in a manner rotatable or tiltable about one axis or a plurality of axes. Corresponding facet elements are known e.g. from US2005/0174650 A1. As a result, the radiation reflected by the reflective facet elements 329 can be directed not just onto a single predetermined second facet element 333, but alternatively onto different second facet elements 333, thus resulting in alteration of the intensity distribution on the second optical element 331 and thus of the angle-dependent intensity distribution of the radiation at the location of the object field. In this way, a deviation of the intensity distribution on the second optical element 331 from a desired intensity distribution can be at least partly corrected because the illumination optical unit is embodied in such a way that the assignment of first facet elements 329 to second facet elements 333 can be altered in a simple manner.

With the aid of the second facet elements 333 and the downstream optics including the mirrors 335, 337 and 339, the first facet elements 329 are imaged in a superimposing fashion onto the object field 341 in the object plane 343. In this case, superimposing imaging is understood to mean that images of the first reflective facet elements 329 arise in the object plane and at least partly overlap there. For this purpose, the second facet elements have a reflective surface having a normal vector, the direction of which defines the orientation of the reflective surface spatially. For each second facet element 333, the direction of the normal vector is in this case chosen such that the first facet element 329 assigned to it is imaged onto the object field 341 in the object plane 343. Consequently, a superimposition of all images of the first facet elements 329 arises in the object plane. In the case of a change in the assignment of first facet elements 329 to second facet elements 333 as a result of tilting of the first facet elements 329, the orientation of the corresponding second facet elements 333 has to be adapted such that the images of the corresponding first facet elements 329 always still arise at the location of the object field 341. For this purpose, the second facet elements 333 are embodied in accordance with FIG. 1.

Since the first facet elements 329 are imaged onto the object field 341, the form of the illuminated object field 341 corresponds to the outer form of the first facet elements 329. The outer form of the first facet elements 329 is therefore usually chosen to be arcuate such that the long boundary lines of the illuminated object field 341 run substantially in the form of arcs of a circle about the optical axis 360 of the projection optical unit 345.

Figure 4A:
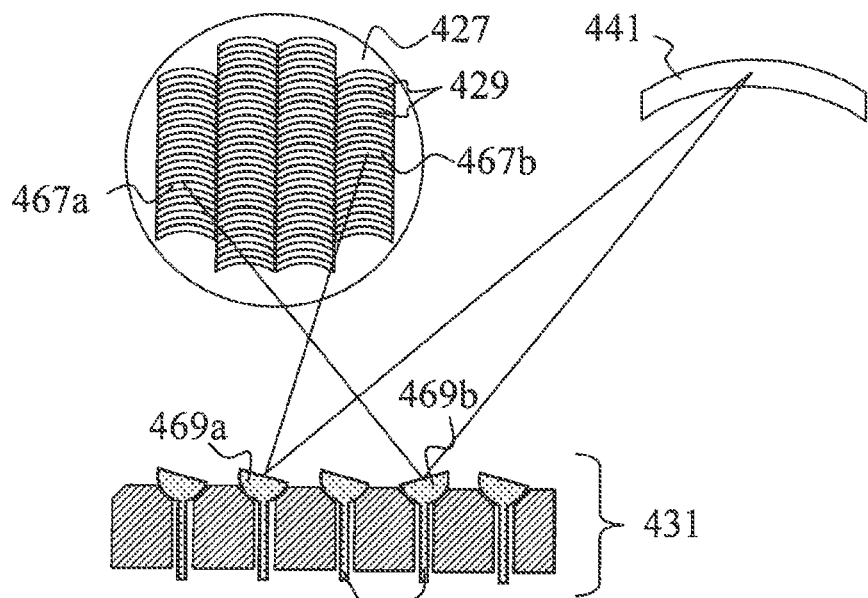
Figure 4B:
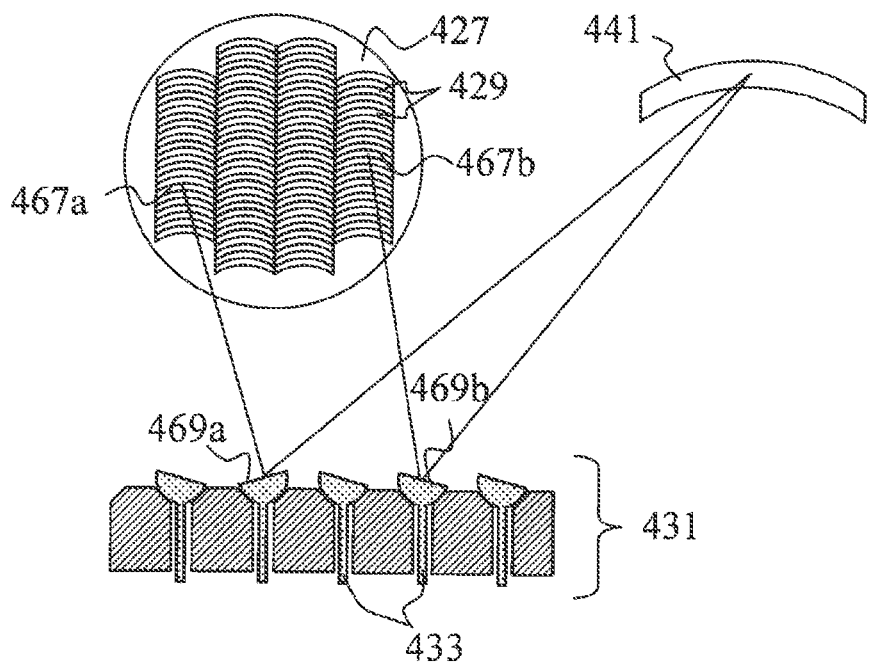

FIGS. 4a and 4b schematically show the use of the optical element according to the disclosure as second optical element 431 in the illumination optical unit. The illustration shows an excerpt from the second optical element 431 including a total of five second facet elements 433. A plan view of the first optical element 427 including the first facet elements 429 and the object field 441 is furthermore shown. The exact functioning is explained by way of example with reference to the specific first facet elements 467a and 467b and the specific second facet elements 469a and 469b. In the state according to FIG. 4a, the reflective optical surface of the first facet element 467a is oriented in such a way that the radiation impinging on the first facet element 467a from the light source unit (not illustrated) is reflected in the direction of the second facet element 469b. Therefore, a radiation beam is present between the first facet element 467a and the second facet element 469b, indicated by the solid line. The second facet element 469b is situated in a first rotation position, such that the reflective surface is oriented in such a way that a reflected radiation beam is directed in the direction of the object field 441. The illustration of additional optical components such as the mirrors 335, 337 and 339 from FIG. 3a has been omitted in this schematic illustration. The optical surface of the first facet element 467b is correspondingly directed such that a radiation beam arises which is directed onto the second facet element 469a. In this case, the second facet element 469a is likewise situated in a first rotation position, such that the optical surface of the second facet element 469a is directed such that the impinging radiation beam is reflected in the direction of the object field 441. In the state according to FIG. 4b, by contrast, the optical surface of the first facet element 467a is oriented such that a radiation beam arises which is directed onto the second facet element 469a. The radiation impinging on the second facet element 469a accordingly has a different direction in the state according to FIG. 4b than in the state according to FIG. 4a.

In this position, the radiation beam is accordingly not reflected in the direction of the object field 441, but rather impinges, for example, on a diaphragm or on a housing of the illumination optical unit. The beam of rays is thus shaded in this position. In order that the radiation beam is nevertheless reflected in the direction of the object field 441, the reflection angle between incident and reflected radiation beam and thus the orientation of the optical surface of the second facet element 469a have to be suitably adapted. For this purpose, the second facet element 469a was brought from the first rotation position, illustrated in FIG. 4a, into a second rotation position (FIG. 4b), that is to say rotated about a rotation axis. In this way, a radiation beam emerging from the first facet element 467a is reflected at the second facet element 469a in the direction of the object field 441 in both states according to FIG. 4a and according to FIG. 4b. The same correspondingly also applies to the second facet element 469b. In the first rotation position according to FIG. 4a, the reflective optical surface of the second facet element 469b is oriented such that a radiation beam emerging from the first facet element 467a is reflected in the direction of the object field 441. A first reflection angle is present at the second facet element 469b. In the state according to FIG. 4b, the second facet element 469b is situated in a second rotation position, in which the optical surface of the second facet element 469b is oriented such that a radiation beam emerging this time from the first facet element 467b is reflected in the direction of the object field 441. Accordingly, a second reflection angle is present, which differs from the first reflection angle. By simply changing the orientations of the first facet elements 429 and the rotation position of the second facet elements 433, it is thus possible to change the assignment between the first facet elements 429 and the second facet elements 433 in order to alter an intensity distribution on the second optical element 431 and thus an angle-dependent intensity distribution of the radiation at the location of the object field 441. Given a number of 500 first facet elements 429 and likewise 500 second facet elements 433, it is possible to form 250 pairs of respectively two first and two second facet elements which are assigned to one another in the manner described above. Each of these 250 pairs can assume two states corresponding to FIGS. 4a and 4b, thus resulting in a total number of $2^{250}$ possible assignments of the 500 first facet elements to the 500 second facet elements which can be set by simple switching.

FIG. 4c shows an excerpt from the second optical element 431 in a further embodiment. The illustration shows five second facet elements 401, the axes of rotation 409 of which have different directions. Depending on the desired reflection angle in the first and second rotation positions, the axis of rotation 409 and the normal vector 407 are individually defined for each facet element 401. In this case, there is inevitably the result that at least two facet elements have different angles between axis of rotation 409 and normal vector 407. On account of the different axes of rotation 409, there is furthermore inevitably the result that the axes of rotation 409 are arranged at different angles relative to the surface 470 of the carrier element 403. In the general case, the angle between the surface 470 and the axis of rotation 409 of a facet element 401 is different than 90°.

Figure 5:
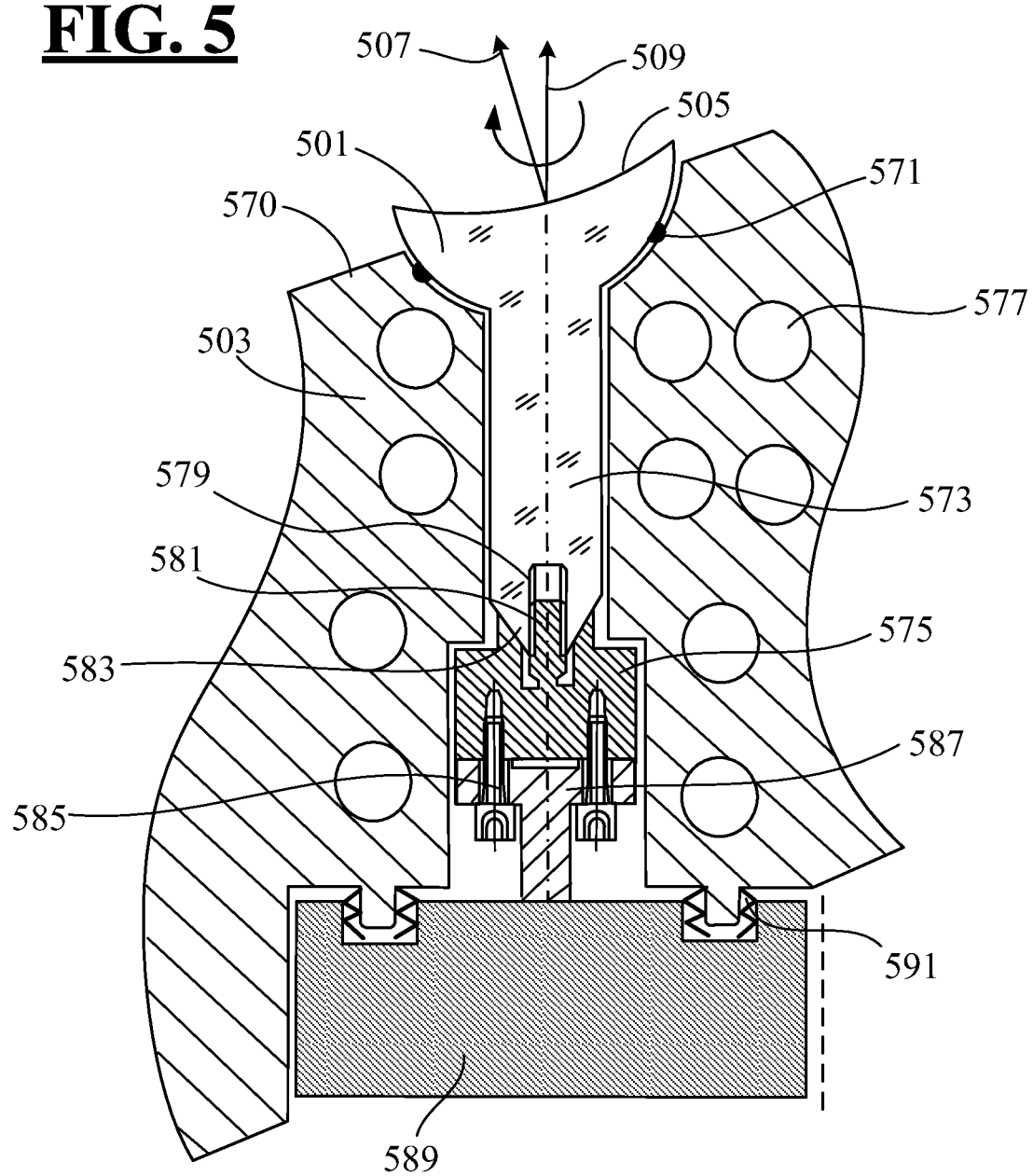
FIG. 5 shows an embodiment for a mechanical mount technology of a rotatably mounted facet element with an actuator.

FIG. 5 shows by way of example an embodiment for a mechanical mount technology with which a facet element according to the disclosure can be mounted in a manner rotatable about an axis of rotation, the axis of rotation intersecting the reflective surface. In this case, the facet element 501 is arranged in a carrier element 503. In this case, the axis of rotation 509 is at an angle with respect to the surface 570 of the carrier element 503 which is different than 90°. Situated between carrier element 503 and facet element 501 is a hard metal ring 571 for fixing the position of the facet element 501 with respect to the carrier element 503. In this case, the hard metal ring 571 simultaneously enables a fixing of the position and a rotatability about the axis of rotation 509, since the rotational degree of freedom about the axis of rotation 509 is not restricted. Instead of a hard metal ring 571, the use of a Teflon ring, for example, is also possible. The facet element 501 has a shaft 573 extending along the axis of rotation 509 away from the reflective surface 505. At the end of the shaft 573, the optical element 501 is connected to a mechanical compensation element 575. For this purpose, the shaft has an internal thread 579 and the mechanical compensation element has a corresponding threaded bolt 581. In order to ensure that the axis of rotation 509 of the optical element 501 is not offset relative to the mechanical compensation element 575, suitable conical joining surfaces 583 are arranged both on the shaft 573 and on the mechanical compensation element 575. The mechanical compensation element 575 is connected via screws 585 to the drive spindle 587 of a motor 589, which serves as an actuator in order to rotate the mechanical compensation element 575 and thus also the connected facet element 501 about an axis of rotation 509. In this case, the rotational position can be determined and monitored for example via an incremental transducer (not illustrated). Arranged between carrier element 503 and motor 589 is a spring system composed of a plurality of combined cup springs 591, which generate the desired contact pressure by which the optical element 501 is pressed against the hard metal ring 571. In this case, the combination of a plurality of cup springs 591 has the advantage that the intensity of the spring force can be set very accurately. Compression springs can also be used as an alternative to cup springs 591. In order to prevent the screw connection between the optical element 501 and the mechanical compensation element 575 from becoming detached over time, the contact location between the conical joining surfaces 583 following the screw connection can be provided with a protective coating. For cooling the optical elements 501, the carrier element 503 is equipped with cooling channels 577 through which a cooling liquid can be conducted.

Figure 6:
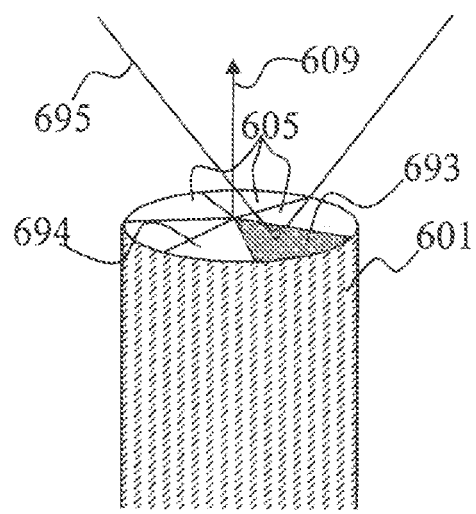
FIG. 6 shows an embodiment of a reflective facet element having a plurality of reflective surfaces.

FIG. 6 shows an embodiment of a reflective facet element 601 having a plurality of reflective surfaces 605 in a first rotation position. In the present case, the facet element 601 has, by way of example, six reflective optical surfaces 605. In this case, the reflective optical surfaces 605 of the facet element 601 are arranged relative to an axis of rotation 609 in such a way that, in a first rotation position, a first reflective surface 693 is situated at an active position, in which a radiation beam 695 impinges on the reflective surface 693, and, in a second rotation position, a second reflective surface 694 is situated at an active position, in which a radiation beam 695 impinges on the second reflective surface 694. Only the first rotation position is illustrated in the figure. The second rotation position results from rotation about the axis of rotation 609 by an angle of approximately 60°, such that the second reflective surface 694 becomes situated at the previous location of the first reflective surface 693. During the operation of the illumination optical unit, therefore, radiation is applied only to the first reflective surface 693 in a first rotation position of the facet element, and only to the second reflective surface 694 in a second rotation position. The impinging radiation beam 695 is accordingly reflected from the first reflective surface 693 in the first rotation position and from the second reflective surface 694 in the second rotation position. In this case, the reflective surface 693 has a normal vector that forms a first angle with the axis of rotation 609. By contrast, the second optical surface 694 forms a second angle with the axis of rotation 609, the second angle differing from the first angle by more than 1°. The same holds true if the normal vector with respect to the first reflective surface 693 in the first rotation position of the facet element differs from the normal vector of the second reflective surface 694 in the second rotation position of the facet element by an angle that is greater than 1°. In both cases the result is that the radiation beam 695 is reflected at different reflection angles, depending on the rotation position in which the facet element 601 is currently situated. This is owing to the fact that, depending on the rotation position, the radiation beam is incident on a different reflective surface 605 with a different orientation. Alternatively, the reflective surfaces 605 can also differ only in terms of their reflectivity. This then has the consequence that the reflected radiation beam 695 has different intensities, depending on the rotation position in which the facet element 601 is situated. Combinations of these two embodiments are likewise possible, that is to say that the facet element 601 can e.g. also be embodied such that two of the reflective optical surfaces 605 differ in terms of their normal vectors and in terms of their reflectivity.

Figure 7:
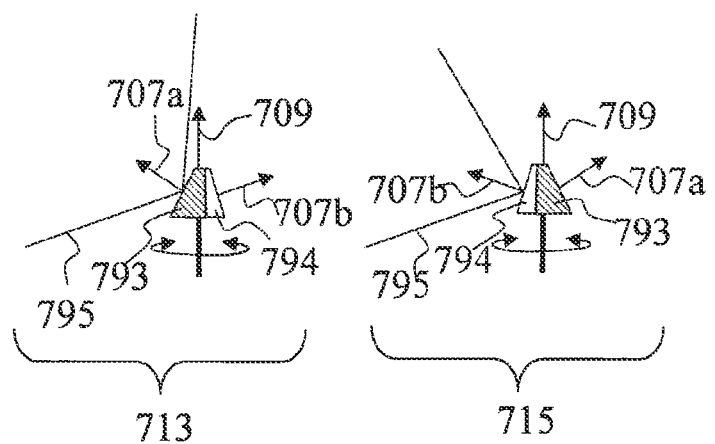
FIG. 7 shows a second embodiment of a reflective facet element having a plurality of reflective surfaces.

FIG. 7 shows an embodiment for a facet element 701 having two reflective surfaces 793 and 794, the restriction to two reflective surfaces serving only for better illustration. Embodiments having further reflective surfaces are likewise possible. In a first rotation position 713, the first optical surface 793 is situated in an active position, in which the radiation beam 795 is incident on the optical surface 793. In a second rotation position 715, the second optical surface 794 is instead situated in the active position, in which the radiation beam 795 is incident on the optical surface 794. In this case, the facet element 701 is configured in such a way that the normal vector 707a with respect to the optical surface 793 in the first rotation position differs from the direction of the normal vector 707b of the second optical surface in the second rotation position. For this reason, depending on the rotation position, the radiation beam 795 is reflected at a different reflection angle. In this embodiment, too, the reflective surfaces 793 and 794 can differ in terms of their reflectivity, such that the reflected radiation beam 795 has different intensities depending on the rotation position.

Figure 8A:
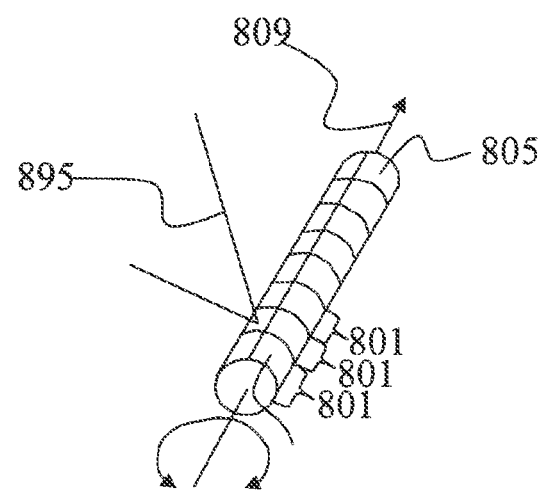
FIG. 8a shows a development of the embodiment according to FIG. 7 in which a plurality of facet elements are connected to one another.

FIG. 8a shows an embodiment in which a group of facet elements 801 are connected to one another, and are mounted in a manner rotatable about a common axis of rotation 809. In this case, each of the facet elements 801 has a plurality of reflective surfaces 805. In this case, each individual one of the facet elements 801 is embodied in accordance with the embodiment according to FIG. 7. The connection of a plurality of facet elements 801 and the rotation about a common axis of rotation 809 have the effect that a larger number of facet elements 801 can be altered in terms of the rotation position via only one motor.

Figure 8B:
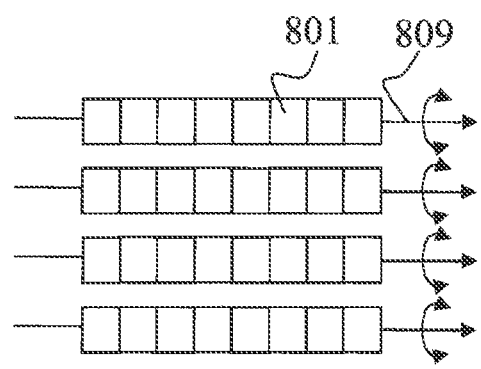

FIG. 8b shows a plan view of an optical element having a plurality of reflective facet elements 801 which are connected to one another in groups in accordance with the embodiment according to FIG. 8a. This results in a two-dimensional arrangement of facet elements in rows, wherein all facet elements 801 in the same row can change their rotation position only jointly. In the case of the embodiments according to FIGS. 8*a* and 8*b*, a cooling of the rotatable facet elements can be achieved via cooling channels running along the axis of rotation through the center of the facet elements.

What is claimed is:

1. An optical element, comprising:
a plurality of reflective facet elements comprising a first facet,
wherein:
the first facet comprises first and second reflective surfaces;
the first facet is rotatable about a rotation axis;
the rotation axis forms a first angle with a normal vector with respect to the first reflective surface;
the rotation axis forms a second angle with a normal vector with respect to the second reflective surface;
the first and the second angles differ by more than 1°; and
the optical element is an EUV microlithography optical element.

2. The optical element of claim 1, wherein a reflectivity of the first reflective surface is different from a reflectivity of the second reflective surface.

3. The optical element of claim 1, further comprising an actuator configured to rotate the first facet element about the rotation axis.

4. An illumination optical unit, comprising:
an optical element according to claim 1, wherein the illumination optical unit is an EUV microlithography illumination optical unit.

5. An apparatus, comprising:
an illumination optical unit comprising an optical element according to claim 1,
wherein the apparatus is an EUV microlithography projection exposure apparatus.

6. The apparatus of claim 5, further comprising a projection optical unit.

7. An optical element, comprising:
a plurality of facet elements comprising a first facet element, each of the plurality of facet elements comprising a reflective surface,
wherein:
the first facet element is rotatable about a rotation axis which intersects the reflective surface of the first facet element;
the reflective surface of the first facet element has a normal vector in a direction spatially defining an orientation of the reflective surface of the first facet element;
an angle between the normal vector and the rotation axis is different from zero; and
the optical element is configured to be used in an illumination optical unit of an EUV microlithography projection exposure apparatus.

8. The optical element of claim 7, wherein the optical element is configured so that the first facet element is rotatable only between two rotation end positions.

9. The optical element of claim 8, further comprising a carrier element, wherein the first facet element is rotatably arranged in the carrier element, and the carrier element and the first facet element each have end stops that define the two rotation end positions.

10. The optical element of claim 6, wherein an angle between the normal vector and the rotation axis is less than 20°.

11. The optical element of claim 7, further comprising an actuator configured to rotate the first facet element about the rotation axis.

12. An illumination optical unit, comprising:
an optical element according to claim 7, wherein the illumination optical unit is an EUV microlithography illumination optical unit.

13. An apparatus, comprising:
an illumination optical unit comprising an optical element according to claim 7,
wherein the apparatus is an EUV microlithography projection exposure apparatus.

14. The apparatus of claim 13, further comprising a projection optical unit.

15. An illumination optical unit, comprising:
an optical element comprising a plurality of reflective facet elements comprising a first facet element, the first facet element comprising first and second reflective surfaces, and the first facet element being rotatable about a rotation axis,
wherein the illumination unit is an EUV microlithography illumination unit, and
wherein the optical element is configured so that during operation of the illumination optical unit:
when the first facet element is in a first position, radiation impinges on only the first reflective surface of the first facet element; and
when the first facet element is in a second position, radiation impinges on only the second reflective surface.

16. The illumination optical unit of claim 15, wherein the first reflective surface has a first normal vector in the first position, the second reflective surface has a second normal vector in the second position, and the first and the second normal vectors form an angle that is greater than 1°.

17. The illumination optical unit of claim 15, wherein a reflectivity of the first reflective surface is different from a reflectivity of the second surface.

18. The illumination optical unit of claim 15, further comprising an actuator, a measuring system and a control system, wherein:
the control system is configured to be in signal communication with the measuring system and the actuator; and
the actuator is configured to rotate the first facet element about the rotation axis based on a signal from the measuring system.

19. The illumination optical unit of claim 18, wherein the illumination optical unit is configured to illuminate an object field in an object plane, and the measuring system is configured to measure an angle-dependent intensity distribution in the object field.

20. A method, comprising:
measuring a first angle intensity distribution at a location in an object field of an illumination optical unit according to claim 18; and
based on the measured angle intensity distribution, rotating the first facet element to change angle intensity distribution at the location in the object field of the illumination optical unit from the first angle intensity distribution to a second angle intensity distribution different from the first angle intensity distribution.

21. An apparatus, comprising:
an illumination optical unit according to claim 15,
wherein the apparatus is an EUV microlithography projection exposure apparatus.

22. The apparatus of claim 21, further comprising a projection optical unit.

23. A method, comprising:
   impinging radiation on the first facet element of an illumination optical unit according to claim 15 so that a plurality of radiation beams emerge from the first facet element; and
   rotating the first facet element about the rotation axis so that for at least one radiation beam: a) a reflection angle changes; and/or b) an intensity changes.

24. An illumination optical unit configured to illuminate an object field in an object plane, the illumination optical unit comprising:
   a first optical element comprising first and second reflective facet elements; and
   a second optical element comprising first and second reflective facet elements,
   wherein:
      the first facet element of the second optical element is rotatable about a rotation axis which intersects a reflective surface of the first facet element of the second optical element;
      the reflective surface of the first facet element of the second optical element has a normal vector in a direction spatially defining an orientation of the reflective surface of the first facet element of the second optical element; and
      an angle between the normal vector and the rotation axis is different from zero.

25. The illumination optical unit of claim 24, wherein:
   the first reflective facet element of the first optical element has a first position, in which, during the operation of the illumination optical unit, the first reflective facet element of the first optical element directs radiation onto the first reflective facet element of the second optical element; and
   the first reflective facet element of the first optical element has a second position, in which, during the operation of the illumination optical unit, the first reflective facet element of the first optical element directs radiation onto the second reflective facet element of the second optical element.

26. An apparatus, comprising:
   an illumination optical unit according to claim 24,
   wherein the apparatus is an EUV microlithography projection exposure apparatus.

27. The apparatus of claim 26, further comprising a projection optical unit.

28. The illumination optical unit of claim 24, wherein:
   the first reflective facet element of the second optical element has a first position in which, during the operation of the illumination optical unit, the first reflective facet element of the second optical element directs a radiation beam emerging from the first reflective facet element of the first optical element toward the object field; and
   the first reflective facet element of the second optical element has a second position in which, during the operation of the illumination optical unit, the first reflective facet element of the second optical element directs a radiation beam emerging from the second reflective facet element of the first optical element toward the object field.

29. The illumination optical unit of claim 28, wherein the first reflective facet element of the second optical element has a third position in which, during operation of the illumination optical unit, the first reflective facet element of the second optical element directs no radiation beam toward the object field.

* * * * *